(12) United States Patent
Danno

(10) Patent No.: US 9,777,399 B2
(45) Date of Patent: Oct. 3, 2017

(54) METHOD FOR PRODUCING SIC SINGLE CRYSTAL

(71) Applicant: TOYOTA JIDOSHA KABUSHIKI KAISHA, Toyota-shi, Aichi-ken (JP)

(72) Inventor: Katsunori Danno, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 130 days.

(21) Appl. No.: 14/920,397

(22) Filed: Oct. 22, 2015

(65) Prior Publication Data

US 2016/0122901 A1    May 5, 2016

(30) Foreign Application Priority Data

Oct. 31, 2014 (JP) ................................ 2014-223796

(51) Int. Cl.
C30B 19/04 (2006.01)
C30B 29/36 (2006.01)
C30B 19/10 (2006.01)

(52) U.S. Cl.
CPC .............. *C30B 19/04* (2013.01); *C30B 19/10* (2013.01); *C30B 29/36* (2013.01)

(58) Field of Classification Search
CPC combination set(s) only.
See application file for complete search history.

(56) References Cited

U.S. PATENT DOCUMENTS

2014/0220325 A1* 8/2014 Loboda ................. C30B 23/005
 428/215
2015/0191849 A1* 7/2015 Shirai .................... C30B 29/36
 428/446

FOREIGN PATENT DOCUMENTS

JP 2006-290635 A 10/2006
JP 2013-252979 * 12/2013 ............ C30B 29/39
JP 2013-252979 A 12/2013

* cited by examiner

*Primary Examiner* — Duy Deo
*Assistant Examiner* — Erin Bergner
(74) *Attorney, Agent, or Firm* — Oliff PLC

(57) ABSTRACT

A method for producing a SiC single crystal, comprising using a Si—C solution having a temperature gradient in which the temperature decreases from the interior toward the surface to grow a SiC single crystal from a seed crystal substrate, wherein the Si—C solution includes Si and Cr, the boron density difference Bs–Bg between the boron density Bs in the seed crystal substrate and the boron density Bg in the growing single crystal is $1 \times 10^{17}/cm^3$ or greater, the chromium density difference Crg–Crs between the chromium density Crs in the seed crystal substrate and the chromium density Crg in the growing single crystal is $1 \times 10^{16}/cm^3$ or greater, and the nitrogen density difference Ng–Ns between the nitrogen density Ns in the seed crystal substrate and the nitrogen density Ng in the growing single crystal is $3.5 \times 10^{18}/cm^3$ to $5.8 \times 10^{18}/cm^3$.

6 Claims, 3 Drawing Sheets

METHOD FOR PRODUCING SIC SINGLE CRYSTAL

TECHNICAL FIELD

The present disclosure relates to a method for producing a SiC single crystal.

BACKGROUND ART

SiC single crystals are thermally and chemically very stable, superior in mechanical strengths, and resistant to radiation, and also have superior physical properties, such as high breakdown voltage and high thermal conductivity compared to Si single crystals. They are therefore able to exhibit high output, high frequency, voltage resistance and environmental resistance that cannot be realized with existing semiconductor materials, such as Si single crystals and GaAs single crystals, and are considered ever more promising as next-generation semiconductor materials for a wide range of applications including power device materials that allow high power control and energy saving to be achieved, device materials for high-speed large volume information communication, high-temperature device materials for vehicles, radiation-resistant device materials and the like.

Typical growth processes for growing SiC single crystals that are known in the prior art include gas phase processes, the Acheson process and solution processes. Among gas phase processes, for example, sublimation processes have a drawback in that grown single crystals have been prone to hollow penetrating defects known as "micropipe defects", lattice defects, such as stacking faults, and generation of polymorphic crystals, but most SiC bulk single crystals are conventionally produced by sublimation processes, with attempts being made to reduce defects in the grown crystals (PTL 1). In the Acheson process, heating is carried out in an electric furnace using silica stone and coke as starting materials, and therefore it has not been possible to obtain single crystals with high crystallinity due to impurities in the starting materials.

Solution processes are processes in which molten Si or an alloy melted in molten Si is formed in a graphite crucible and C is dissolved into the molten liquid, and a SiC crystal layer is deposited and grown on a seed crystal substrate set in the low temperature zone. Solution processes can be expected to reduce defects compared to sublimation processes, since crystal growth is carried out in a state of near thermal equilibrium, compared to gas phase processes. In recent years, therefore, several methods for producing SiC single crystals by solution processes have been proposed, and methods for obtaining SiC single crystals with few crystal defects have also been proposed (PTL 2).

CITATION LIST

Patent Literature

[PTL 1] Japanese Unexamined Patent Publication No. 2006-290635
[PTL 2] Japanese Unexamined Patent Publication No. 2013-252979

SUMMARY OF THE INVENTION

Problems to be Solved by the Invention

Using the methods described in PTLs 1 and 2 it is possible to reduce the threading dislocation density in the grown crystal to some extent. However, since they require formation of a concentration gradient layer (buffer layer) between the seed crystal substrate and the grown crystal, they are still inadequate for stably reducing the threading dislocation density. A demand therefore exists for a method of producing a SiC single crystal having low threading dislocation density, without formation of a buffer layer.

Means for Solving the Problems

The present disclosure relates to a method for producing a SiC single crystal, comprising using a Si—C solution having a temperature gradient in which the temperature decreases from the interior toward the surface to grow a SiC single crystal from a SiC seed crystal substrate, wherein:

the Si—C solution includes Si and Cr, the boron density difference Bs–Bg between the boron density Bs in the seed crystal substrate and the boron density Bg in the growing SiC single crystal is $1 \times 10^{17}/cm^3$ or greater, the chromium density difference Crg–Crs between the chromium density Crs in the seed crystal substrate and the chromium density Crg in the growing SiC single crystal is $1 \times 10^{16}/cm^3$ or greater, and the nitrogen density difference Ng–Ns between the nitrogen density Ns in the seed crystal substrate and the nitrogen density Ng in the growing SiC single crystal is $3.5 \times 10^{18}/cm^3$ to $5.8 \times 10^{18}/cm^3$.

Effect of the Invention

According to the method of the present disclosure it is possible to obtain a SiC single crystal having low threading dislocation density, without formation of a buffer layer.

DESCRIPTION OF EMBODIMENTS

Figure 1:
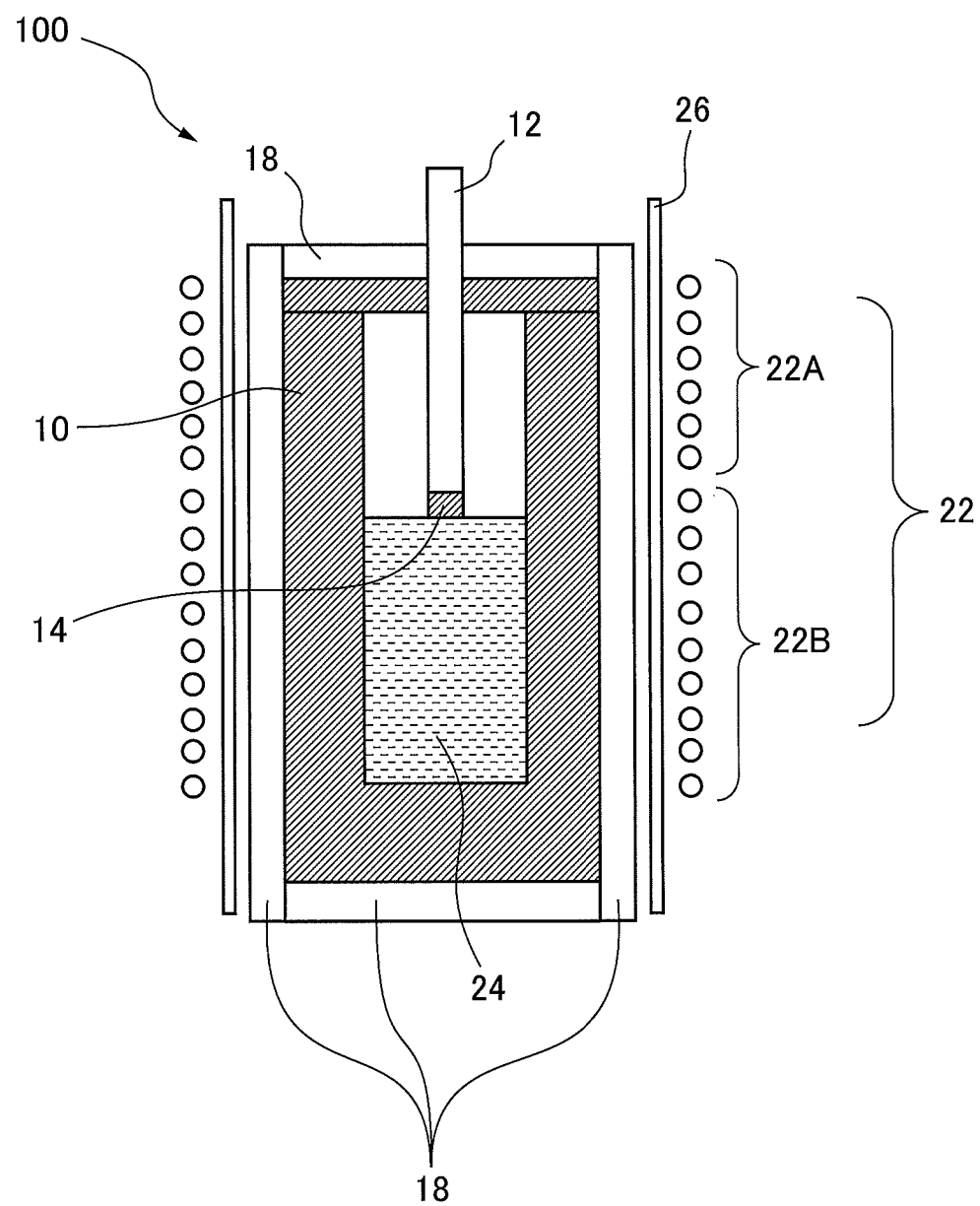
FIG. 1 is a cross-sectional schematic drawing of a single crystal production apparatus based on a solution process, to be used for the method of the present disclosure.

Throughout the present specification, the indication "-1" in an expression, such as "(000-1) face", is used where normally a transverse line is placed over the numeral.

When a SiC single crystal is grown by a solution process, nitrogen may generally be present in the grown crystal. Since nitrogen alters the lattice constant of SiC, differing nitrogen densities between the seed crystal substrate and the grown crystal can produce significant differences in the lattice constant, potentially causing generation of new threading dislocations in the grown crystal. In the prior art, therefore, the nitrogen density difference between the seed crystal substrate and the grown crystal is eliminated, or a buffer layer which continuously changes the nitrogen density between the seed crystal substrate and the grown crystal is formed, so that distortion due to differences in the lattice constant is alleviated.

However, even if the nitrogen density difference between the seed crystal substrate and the grown crystal is eliminated, it is not evident specifically in what range the nitrogen density difference should be reduced. In addition, in order to form a buffer layer by a solution process it is necessary to introduce a nitrogen material, such as nitrogen gas, during the growth, but it has not been easy to precisely form a buffer layer by a solution process, as the introduction of the nitrogen material can potentially cause disturbance of the growth conditions. Furthermore, while forming a buffer layer reduces microscopic distortions, it is difficult to achieve stable reduction in the threading dislocation, since the nitrogen density difference between the seed crystal substrate and the grown crystal is not reduced, and the total amount of distortion in the entire crystal including the seed crystal substrate and the grown crystal is not reduced.

In light of these issues, the present inventors have conducted diligent research on a method that, without requiring formation of a buffer layer between the seed crystal substrate and the grown crystal, allows production of a SiC single crystal with low threading dislocation density, and we have discovered the method of the present disclosure.

It has been found that when a SiC single crystal grown by a sublimation process using a seed crystal substrate is used to grow a SiC single crystal by a solution process using a Si—Cr-based solvent as the Si—C solution, controlling the nitrogen density difference between the seed crystal substrate and the grown crystal to within a prescribed range, in consideration of the influence of B and Cr, is effective for minimizing generation of new threading dislocations to obtain a SiC single crystal with low threading dislocation density.

The method of the present disclosure is directed to a method for producing a SiC single crystal, comprising using a Si—C solution having a temperature gradient in which the temperature decreases from the interior toward the surface to grow a SiC single crystal from a SiC seed crystal substrate, wherein the Si—C solution includes Si and Cr, the boron density difference Bs−Bg between the boron density Bs in the seed crystal substrate and the boron density Bg in the growing SiC single crystal is $1 \times 10^{17}/cm^3$ or greater, the chromium density difference Crg−Crs between the chromium density Crs in the seed crystal substrate and the chromium density Crg in the growing SiC single crystal is $1 \times 10^{16}/cm^3$ or greater, and the nitrogen density difference Ng−Ns between the nitrogen density Ns in the seed crystal substrate and the nitrogen density Ng in the growing SiC single crystal is $3.5 \times 10^{16}/cm^3$ to $5.8 \times 10^{18}/cm^3$.

According to the method of the present disclosure it is possible to grow a SiC single crystal with low threading dislocation density, substantially without forming a buffer layer between the seed crystal substrate and the grown crystal. Throughout the present specification, "threading dislocation" includes "threading screw dislocation" and "threading edge dislocation".

In the prior art, the threading dislocation density has tended to be higher with greater crystal growth thickness, resulting from distortion due to differences in the lattice constant between the seed crystal substrate and the grown crystal. However, according to the method of the present disclosure, it is possible to obtain a SiC single crystal with low threading dislocation density even when a SiC single crystal is grown to a large thickness. In particular, it is possible to obtain a SiC single crystal with low threading dislocation density, even if the growth thickness is, preferably 1 mm or greater, more preferably 2 mm or greater and even more preferably 3 mm or greater. According to the method of the present disclosure, it is not necessary to form a buffer layer when growing a thick SiC single crystal, and therefore the growth time can be shortened compared to when a buffer layer is formed.

While it is not our intention to be constrained by theory, when Cr is present in a greater amount and B is present in a smaller amount in the grown crystal than in the seed crystal substrate, both situations act to increase the lattice constant of the grown crystal with respect to the seed crystal substrate. On the other hand, when nitrogen is present in a greater amount in the grown crystal than in the seed crystal substrate, this acts to decrease the lattice constant of the grown crystal with respect to the seed crystal substrate. Thus, reducing the lattice constant by the action of N, by the amount that the lattice constant has increased by the actions of Cr and B, allows a SiC single crystal to be obtained that has a small difference in lattice constant between the seed crystal substrate and the grown crystal, and low threading dislocation density. This will now be explained in detail.

A higher nitrogen density in the SiC single crystal results in a smaller lattice constant of the SiC. Thus, as the nitrogen density of the grown crystal increases above the nitrogen density of the seed crystal substrate, the lattice constant of the grown crystal is smaller compared to the lattice constant of the seed crystal substrate.

When a SiC single crystal is grown by a solution process, generally a SiC single crystal that has been grown by a sublimation process is used as the seed crystal substrate. A SiC single crystal grown by a sublimation process contains nitrogen and boron, and in particular may have a higher boron density than a SiC single crystal grown by a solution process.

When a SiC single crystal is grown by a solution process using a seed crystal substrate grown by a sublimation process, the boron density may be lower in the grown crystal compared to the boron density of the seed crystal substrate. A lower boron density in the SiC single crystal results in a larger lattice constant of the SiC.

The boron density of a SiC single crystal grown by a sublimation process is generally $1 \times 10^{17}/cm^3$ to $1 \times 10^{18}/cm^3$, and no higher than a maximum of $1 \times 10^{19}/cm^3$. In contrast, the Si—C solution used in the method of the present disclosure contains substantially no boron other than unavoidable impurities, and therefore the boron density of the SiC single crystal grown by a solution process is relatively very low, so as to be below the detection limit of SIMS, i.e., not greater than $1 \times 10_{14}/cm^3$.

Thus, the lower limit for the boron density difference Bs−Bg between the boron density Bs in the seed crystal substrate and the boron density Bg in the growing SiC single crystal is substantially $1 \times 10^{17}/cm^3$ or greater, $8 \times 10^{17}/cm^3$ or greater, or even $1 \times 10^{18}/cm^3$ or greater. There is no particular restriction on the upper limit for Bs−Bg, and it is substantially no greater than $1 \times 10^{19}/cm^3$, for example.

On the other hand, when a SiC single crystal is grown by a solution process, a solvent containing Si and Cr (also referred to as "Si—Cr-based solvent") can be used as the Si—C solution in order to increase the amount of carbon dissolution. Throughout the present specification, "Si—C solution" refers to a C-dissolved solution, of which the solvent is a molten liquid containing Si and Cr. A SiC single crystal grown by a solution process using a Si—Cr-based solution as the Si—C solution may contain chromium.

When a SiC single crystal is grown by a solution process using a seed crystal substrate grown by a sublimation process and a Si—Cr-based solvent, the chromium density is higher in the grown crystal, compared to the chromium density of the seed crystal substrate. A higher chromium density in the SiC single crystal results in a larger lattice constant of the SiC. Thus, a higher chromium density of the grown crystal compared to the chromium density of the seed crystal substrate results in a greater lattice constant of the grown crystal compared to the lattice constant of the seed crystal substrate.

The chromium density of a SiC single crystal grown by a sublimation process is generally $1\times10^{13}/cm^3$ to $1\times10^{14}/cm^3$. The chromium density of a SiC single crystal grown by a solution process is relatively very high, and is $1\times10^{16}/cm^3$ to $5\times10^{17}/cm^3$ and preferably $6\times10^{16}$ to $1\times10^{17}/cm^3$.

Thus, the lower limit for the chromium density difference Crg–Crs between the chromium density Crs in the seed crystal substrate and the chromium density Crg in the growing SiC single crystal is substantially $1\times10^{16}/cm^3$ or greater, $6\times10^{16}/cm^3$ or greater, or even $1\times10^{17}/cm^3$ or greater. There is no particular restriction on the upper limit for the chromium density difference Crg–Crs, and it is substantially no greater than $5\times10^{17}/cm^3$, for example.

The composition of the Si—C solution is preferably Si/Cr=50 to 80/20 to 50, as the atomic composition percentage. The Si—C solution contains substantially no boron. The Si—C solution preferably has a surface temperature of 1800 to 2200° C. The aforementioned compositional range and temperature range of the Si—C solution can minimize fluctuation in the amount of dissolution of C. If a SiC single crystal is grown by a solution process by using a Si—C solution which has a composition within the aforementioned range, the chromium density in the grown SiC single crystal will be substantially constant. While it is not our intention to be constrained by theory, this is believed to be because an amount of chromium in a Si—C solution within the aforementioned compositional range exceeds the amount corresponding to the upper solid solution limit for chromium that can exist in solid solution in the grown crystal. Within the aforementioned temperature range for a Si—C solution, a higher temperature of the Si—C solution results in higher Cr density of the SiC single crystal grown by a solution process.

An element X that can form a liquid phase (solution) in thermodynamic equilibrium with the SiC (solid phase) may also be added to the Si—C solution in addition to Si and Cr, examples of such elements including Mn, Ni, Ce, Co and V. Even if these elements are added to the Si—C solution, there is substantially no incorporation thereof into the growing SiC single crystal and their effects on the lattice constant can be ignored. When the Si—C solution contains an additional element X in addition to Si and Cr, a Si—C solution wherein the solvent is a molten liquid of Si/Cr/X=50 to 80/20 to 40/0 to 10, as atomic composition percentage, is preferred since the fluctuation in C and Cr dissolution will be low.

The nitrogen density difference Ng–Ns, between the nitrogen density Ns in the seed crystal substrate and the nitrogen density Ng in the growing SiC single crystal, is greater than $2.0\times10^{18}/cm^3$ and preferably $3.5\times10^{18}/cm^3$ or greater. With this range for the lower limit of Ng–Ns, it will be possible to reduce the effects of B and Cr on the lattice constant. The upper limit for Ng–Ns, on the other hand, is smaller than $6.2\times10^{18}/cm^3$ and preferably no greater than $5.8\times10^{18}/cm^3$, from the viewpoint of reducing the effect that contamination of nitrogen itself into the SiC single crystal has on lattice distortion. Thus, the nitrogen density difference Ng–Ns, between the nitrogen density Ns in the seed crystal substrate and the nitrogen density Ng in the growing SiC single crystal, may be, for example, $3.5\times10^{18}/cm^3$ to $5.8\times10^{18}/cm^3$.

The nitrogen density in the SiC grown crystal may be adjusted, for example, by varying the nitrogen partial pressure in the atmosphere inside the crucible used for crystal growth.

When the nitrogen partial pressure in the atmosphere inside the crucible is increased, it is possible to increase the amount of dissolution of nitrogen in the Si—C solution and increase the nitrogen density in the grown crystal. The nitrogen partial pressure in the atmosphere inside the crucible used for crystal growth can be adjusted, for example, by adding a prescribed amount of nitrogen gas to an inert gas, such as argon or helium. Adjustment of the nitrogen partial pressure may be carried out, for example, by introducing a prescribed amount of an inert gas, such as Ar or He, and $N_2$ gas, through a gas inlet provided in a water-cooling chamber in the single crystal production apparatus.

The nitrogen partial pressure in the atmosphere inside the crucible will vary depending on the nitrogen density of the seed crystal substrate used, the target nitrogen density for the grown crystal, and the like, but it is controlled to preferably no greater than 5 kPa, more preferably no greater than 2 kPa and even more preferably essentially 0 kPa. However, a trace amount of nitrogen will be present in the atmosphere inside the crucible even at 0 kPa, and therefore solid solution of nitrogen into the SiC grown crystal may still take place.

Direct addition of nitrides (nitrogen compounds) into the Si—C solution, either in addition to or independently from varying the nitrogen partial pressure in the atmosphere inside the crucible, can also change the amount of nitrogen dissolution in the Si—C solution to allow adjustment of the nitrogen density of the SiC grown crystal. Furthermore, varying the temperature of the Si—C solution can also change the amount of nitrogen dissolution in the Si—C solution to allow adjustment of the nitrogen density of the SiC grown crystal. For example, within a surface temperature range of 1800 to 2200° C., increasing the temperature of the Si—C solution can increase the amount of nitrogen dissolution into the Si—C solution.

Since nitrogen sources, such as nitrogen gas in the pores of the graphite crucible and nitrogen gas adsorbed onto the heat-insulating material, may be present in addition to the atmosphere gas and added nitrides, it is preferred to adjust the nitrogen partial pressure in the atmosphere, taking into consideration the effects of nitrogen from these nitrogen sources, and to control the amount of nitrogen dissolving in the Si—C solution.

The nitrides that may be used may be any desired nitrogen compounds so long as they do not introduce unwanted impurities into the SiC grown crystal, and examples thereof include chromium nitride, nickel nitride, and mixtures of the same. The amount of nitride added may be any desired amount, and generally the amount of addition may be a trace amount with respect to the Si—C solution. For example, it may be 0 to 0.5 at % or 0.02 to 0.1 at % in terms of nitrogen atoms, based on the total amount of the nitride-containing Si—C solution. The addition of such nitrides into the Si—C solution does not affect the chromium density of the SiC single crystal grown by a solution process.

The nitrogen density, boron density and chromium density in the SiC single crystal can be measured by using secondary ion mass spectrometry (SIMS). In SIMS, the nitrogen density, boron density and chromium density in the SiC crystal can be measured by mass spectrometry while removing the surface of the SiC crystal by Ar ion sputtering.

Throughout the present specification, the units for the nitrogen density, boron density and chromium density are /cm$^3$ (number of atoms/cm$^3$).

The threading dislocation density of the SiC single crystal to be obtained by the method of the present disclosure is preferably less than $1\times10^5$/cm$^2$, more preferably no greater than $3\times10^4$/cm$^2$ and even more preferably no greater than $1\times10^3$/cm$^2$.

The presence or absence of threading dislocations in the grown crystal can be evaluated by mirror polishing so as to expose the (0001) plane, performing molten alkali etching using molten potassium hydroxide, sodium peroxide or the like to accentuate the dislocations, and observing the etch pits on the surface of the SiC single crystal with a microscope.

A solution process is used in the method of the present disclosure. A solution process for production of a SiC single crystal is a process in which the surface region of the Si—C solution becomes supersaturated due to formation of a temperature gradient in which the temperature decreases from the interior of the Si—C solution toward the surface of the solution in a crucible, and a SiC single crystal is grown on a seed crystal substrate using the seed crystal substrate contacting with the Si—C solution as the origin.

In this method, a SiC single crystal formed in a common manner by a sublimation process, having quality commonly used for production of SiC single crystals, may be used as the seed crystal substrate.

Such a SiC single crystal formed in a common manner by a sublimation process generally includes numerous threading dislocations, and for example, it may have $1\times10^4$ to $1\times10^5$/cm$^2$ threading dislocations. According to the method of the present disclosure it is possible to obtain threading dislocation density similar to the threading dislocation density of the seed crystal substrate, and therefore it is preferred to use a seed crystal substrate with low threading dislocation density.

A SiC single crystal formed in a common manner by a sublimation process may have a nitrogen density of, for example, $4.2\times10^{18}$/cm$^3$ to 1.5 to $10^{19}$/cm$^3$. However, according to the method of the present disclosure, it is sufficient if the difference of the nitrogen density of the grown crystal with respect to the nitrogen density of the seed crystal substrate is within the range specified above, and there is no effect by the absolute value of the nitrogen density of the seed crystal substrate. The seed crystal substrate to be used for the present method may have any desired shape, such as laminar, discoid, cylindrical, square columnar, truncated circular conic or truncated pyramidal.

Placement of the seed crystal substrate in the single crystal production apparatus may be carried out by holding the top face of the seed crystal substrate on the seed crystal holding shaft.

Contact of the seed crystal substrate with the Si—C solution may be carried out by lowering the seed crystal holding shaft holding the seed crystal substrate toward the Si—C solution surface, and contacting it with the Si—C solution while the bottom face of the seed crystal substrate is parallel to the Si—C solution surface. The seed crystal substrate may be held at a prescribed position relative to the Si—C solution surface for growth of the SiC single crystal.

The holding position of the seed crystal substrate may be such that the position of the bottom face of the seed crystal substrate matches the Si—C solution surface, or is below the Si—C solution surface, or is above the Si—C solution surface. When it is held so that the bottom face of the seed crystal substrate is at a position above the Si—C solution surface, the seed crystal substrate is contacted once with the Si—C solution so that the Si—C solution contacts with the bottom face of the seed crystal substrate, and it is then raised to the prescribed position. The position of the bottom face of the seed crystal substrate may match the Si—C solution surface or be lower than the Si—C solution surface, but it is preferred that the Si—C solution does not contact with the seed crystal holding shaft, in order to prevent generation of polycrystals. In such methods, the position of the seed crystal substrate may be adjusted during crystal growth.

The seed crystal holding shaft may be a graphite shaft holding the seed crystal substrate at one end face. The seed crystal holding shaft may have any desired shape, such as cylindrical or square columnar, and there may be used a graphite shaft having the same end face shape as the top face of the seed crystal.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

FIG. 1 shows an example of a SiC single crystal production apparatus suitable for carrying out the method of the present disclosure. The illustrated SiC single crystal production apparatus 100 comprises a crucible 10, wherein the crucible 10 receives a Si—C solution 24, a temperature gradient is formed in which the temperature is decreased from the interior of the Si—C solution toward the surface of the solution, and the seed crystal substrate 14 that is held at the tip of the vertically movable seed crystal holding shaft 12 is contacted with the Si—C solution 24 to allow growth of the SiC single crystal. The crucible 10 and the seed crystal holding shaft 12 are preferably rotated.

The Si—C solution 24 is prepared by loading the starting materials into the crucible 10, melting them by heating to prepare molten liquid containing Si and Cr, and dissolving C therein. If the crucible 10 is a carbonaceous crucible, such as a graphite crucible, or SiC crucible, C will dissolve into the molten liquid by dissolution of the crucible 10, thereby forming a Si—C solution 24. This will avoid the presence of undissolved C in the Si—C solution 24, and prevent waste of SiC due to deposition of the SiC single crystal onto the undissolved C. The supply of C may be carried out by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be configured with an upper level coil 22A and a lower level coil 22B. The upper level coil 22A and lower level coil 22B are independently controllable.

Since the temperatures of the crucible 10, heat-insulating material 18, quartz tube 26 and high-frequency coil 22 will be high, they are situated inside a water-cooling chamber. The water-cooling chamber is provided with a gas inlet and a gas exhaust vent to allow adjustment of the nitrogen partial pressure in the apparatus and in the crucible using Ar, He, N$_2$ or the like.

The temperature of the Si—C solution 24 usually has a temperature distribution with a lower temperature at the surface than the interior of the Si—C solution 24 due to thermal radiation and the like. It is possible to further create a prescribed temperature gradient in the Si—C solution 24 in the direction perpendicular to the surface of the Si—C solution 24 so that an upper portion of the solution in which the seed crystal substrate 14 is immersed is at low temperature while a lower portion of the solution is at high temperature, by adjusting the number of coils and spacing of the high-frequency coil 22, the positional relationship of the high-frequency coil 22 and the crucible 10 in the height direction, and the output of the high-frequency coil 22. For example, the output of the upper level coil 22A may be smaller than the output of the lower level coil 22B, to form a prescribed temperature gradient in the Si—C solution 24 in which an upper portion of the solution is at low temperature while a lower portion of the solution is at high temperature.

The C that has dissolved in the Si—C solution 24 is dispersed by diffusion and convection. In the region near the bottom face of the seed crystal substrate 14, a temperature gradient is formed so that it is at lower temperature than the lower portion of the Si—C solution 24, due to control of output from the upper level/lower level of the coil 22, heat radiation from the surface of the Si—C solution 24 and heat loss through the seed crystal holding shaft 12. When the C that has dissolved into the lower part of the solution that is at high temperature and has high solubility reaches the region near the bottom face of the seed crystal substrate 14 which is at low temperature and has low solubility, a supersaturated state appears and a SiC single crystal is grown on the seed crystal substrate 14 by virtue of supersaturation as a driving force.

In some embodiments, meltback may be carried out in which the surface layer of the SiC seed crystal substrate 14 is dissolved in the Si—C solution 24 and removed prior to growth of SiC single crystal. Since the surface layer of the seed crystal substrate 14 on which the SiC single crystal is grown may have an affected layer, such as a dislocation, a natural oxide film, or the like, removal of these by dissolution prior to growth of a SiC single crystal is effective for growing a high-quality SiC single crystal. Although the thickness of the layer to be dissolved depends on the processed conditions of the surface of the SiC seed crystal substrate 14, it is preferably about 5 to 50 μm for sufficient removal of an affected layer and a natural oxide film.

The meltback may be carried out by forming in the Si—C solution 24 a temperature gradient in which the temperature increases from the interior of the Si—C solution 24 toward the surface of the solution, i.e. by forming a temperature gradient in a direction opposite to the case of the SiC single crystal growth. The temperature gradient in the opposite direction can be formed by controlling the output of the high-frequency coil 22.

In certain embodiments, the seed crystal substrate 14 may be preheated in advance, and then the same is contacted with the Si—C solution 24. If the seed crystal substrate 14 at a low temperature is contacted with the Si—C solution 24 at high temperature, heat shock dislocation may be generated in the seed crystal substrate 14. Preheating of the seed crystal substrate 14 before contacting the seed crystal substrate 14 with the Si—C solution 24 prevents heat shock dislocation and is effective for growth of a high-quality SiC single crystal. The seed crystal substrate 14 may be heated together with the seed crystal holding shaft 12. Alternatively, the Si—C solution 24 may be heated to the temperature for crystal growth after contacting the seed crystal substrate 14 with the Si—C solution 24 at a relatively low temperature. This is also effective for preventing heat shock dislocations and growing a high-quality SiC single crystal.

EXAMPLES

Example 1

There was prepared a SiC single crystal formed by a sublimation process, which was a discoid 4H—SiC single crystal with a diameter of 12 mm, a thickness of 700 μm, and the bottom face as the (000-1) plane, for use as a seed crystal substrate. The seed crystal substrate had a threading dislocation density of $3 \times 10^4/cm^2$, a nitrogen density of $4.2 \times 10^{18}/cm^3$, a boron density of $8 \times 10^{17}/cm^3$ and a chromium density of $1 \times 10^{14}/cm^3$. A cylindrical graphite shaft with a diameter of 12 mm was prepared as the seed crystal holding shaft 12, and the top face of the seed crystal substrate was bonded to roughly the center section of the end face of the cylindrical graphite shaft, by using a graphite adhesive.

Measurement of the threading dislocation density was carried out by mirror polishing the (0001) face of the crystal, using molten KOH and $Na_2O_2$ at 510° C. for alkali etching, observing the etched surface with a microscope, and counting the number of etch pits. The threading dislocation densities measured in the following examples and comparative examples are the values measured based on all of the observed etch pits.

The nitrogen density, boron density and chromium density were measured by secondary ion mass spectrometry (SIMS, product of Cameca). The reference sample used was a SiC substrate into which N, B and Cr ion had been implanted.

A single crystal production apparatus 100 shown in FIG. 1 was used, Si/Cr with an atomic composition ratio of 60:40 was charged into a graphite crucible 10 for housing the Si—C solution 24, as a molten liquid starting material for formation of the Si—C solution 24, and $Cr_2N$ powder (3N by Mitsuwa Chemicals Co., Ltd.) was added as a nitride donor starting material at 0.02 at %, in terms of nitrogen atoms, based on the total amount of the nitride-containing Si—C solution.

After vacuum suction of the interior of the single crystal production apparatus 100 to $1 \times 10^{-3}$ Pa, argon gas was introduced to 1 atmosphere and the air inside the single crystal production apparatus 100 was exchanged with argon, to control the nitrogen partial pressure to 0 kPa. The high-frequency coil 22 was electrified to melt the starting material in the graphite crucible 10 by heating, thereby forming a Si/Cr alloy molten liquid. Then, a sufficient amount of C was dissolved into the Si/Cr alloy molten liquid from the graphite crucible 10 to form a Si—C solution 24.

The outputs of the upper level coil 22A and lower level coil 22B were adjusted to heat the graphite crucible 10 so that the temperature on the surface of the Si—C solution 24 was increased to 2000° C., and a temperature gradient became 20° C./cm, in which the temperature decreased from the solution interior in a range of 1 cm from the solution surface, toward the solution surface. Temperature measurement of the surface of the Si—C solution 24 was performed with a radiation thermometer, and measurement of the temperature gradient of the Si—C solution 24 was performed using a vertically movable thermocouple.

Seed touching was conducted, in which the position of the bottom face of the seed crystal substrate 14 was placed at a position matching the liquid surface of the Si—C solution 24, and the bottom face of the seed crystal substrate 14 was contacted with the Si—C solution 24, while keeping the bottom face of the seed crystal substrate 14 bonded to the graphite shaft parallel to the liquid surface of the Si—C solution 24. The graphite shaft was then raised 1.5 mm so as to prevent the Si—C solution 24 from seeping upward and contacting the graphite shaft, and was held at that position for 10 hours for growth of a crystal.

Upon completion of the crystal growth, the graphite shaft was raised and the seed crystal substrate 14 and the SiC crystal grown from the seed crystal substrate 14 were severed from the Si—C solution 24 and the graphite shaft and were recovered. The obtained grown crystal had a diameter of 12 mm and a thickness of 3.5 mm, and was a SiC single crystal containing no miscellaneous crystals.

Figure 2:
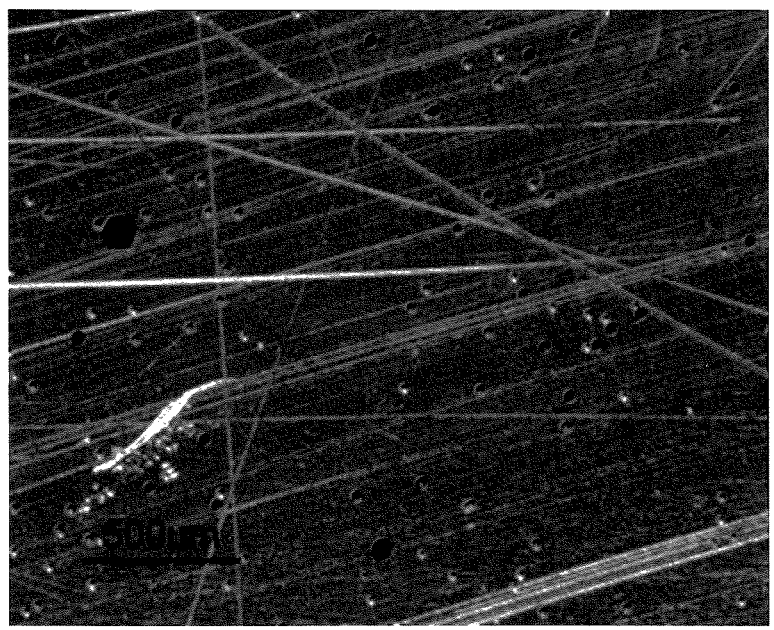
FIG. 2 is an observational photograph of threading dislocation in a SiC single crystal grown in an example.

In order to measure the threading dislocation density of the obtained grown crystal, the grown crystal portion was cut out from the seed crystal substrate, the (0001) face of the grown crystal was subjected to mirror polishing, and molten KOH and $Na_2O_2$ at 510° C. were used for alkali etching. The etched surface was observed with a microscope. FIG. 2 shows a photomicrograph of the etched surface. The number of etch pits seen in FIG. 2 were counted, and the threading dislocation density of the grown crystal was measured.

The threading dislocation density of the grown crystal was $3\times10^4/cm^2$, which was the same as the threading dislocation density of the seed crystal substrate, confirming no generation of new threading dislocations. The etch pits seen in FIG. 2 are threading dislocations derived from the seed crystal.

The nitrogen density, boron density and chromium density in the grown crystal were measured on the mirror polished growth surface, by secondary ion mass spectrometry (SIMS, product of Cameca). The reference sample used was a SiC substrate into which N, B and Cr ion had been implanted. The nitrogen density of the grown crystal was $1.0\times10^{19}/cm^3$, the boron density was not greater than the detection lower limit of $1\times10^{14}/cm^3$ (also referred to hereunder as $1\times10^{14}/cm^3$), and the chromium density was $1\times10^{17}/cm^3$.

The nitrogen density difference between the seed crystal substrate and the grown crystal was $5.8\times10^{18}/cm^3$, and the boron density difference and chromium density difference were calculated based on the detection lower limit values, the boron density difference being $8\times10^{17}/cm^3$ and the chromium density difference being $1\times10^{17}/cm^3$.

Example 2

A seed crystal substrate similar to Example 1 was used, except that it had a threading dislocation density of $1\times10^4/cm^2$ and a nitrogen density of $4.8\times10^{18}/cm^3$, and crystal growth was carried out by the same method as Example 1, except that the temperature on the surface of the Si—C solution 24 was 1900° C. and no nitride was added, after which the grown SiC crystal was recovered.

Measurement of the threading dislocation density of the grown crystal and measurement of the nitrogen density, boron density and chromium density were conducted in the same manner as Example 1. The obtained grown crystal had a diameter of 12 mm and a thickness of 2.6 mm, and the grown crystal was a SiC single crystal containing no miscellaneous crystals. The threading dislocation density of the grown crystal was $1\times10^4/cm^2$, which was the same as the threading dislocation density of the seed crystal substrate. The nitrogen density of the grown crystal was $8.3\times10^{18}/cm^3$, the boron density was not greater than the detection limit of $1\times10^{14}/cm^3$, and the chromium density was $6\times10^{17}/cm^3$.

The nitrogen density difference between the seed crystal substrate and the grown crystal was $3.5\times10^{18}/cm^3$, and the boron density difference and chromium density difference were calculated based on the minimum measurable values, the boron density difference being $8\times10^{17}/cm^3$ and the chromium density difference being $6\times10^{17}/cm^3$.

Comparative Example 1

A seed crystal substrate similar to Example 1 was used, except that it had a threading dislocation density of $1\times10^4/cm^2$ and a nitrogen density of $4.7\times10^{18}/cm^3$, and crystal growth was carried out by the same method as Example 1, except that as the nitride donor starting material there was added $Cr_2N$ powder (3N by Mitsuwa Chemicals Co., Ltd.) at 0.07 at % in terms of nitrogen atoms, based on the total amount of the nitride-containing Si—C solution, after which the grown SiC crystal was recovered.

Measurement of the threading dislocation density of the grown crystal and measurement of the nitrogen density, boron density and chromium density were conducted in the same manner as Example 1. The obtained grown crystal had a diameter of 12 mm and a thickness of 3.5 mm, and the grown crystal was a SiC single crystal containing no miscellaneous crystals. The threading dislocation density of the grown crystal was $1\times10^5/cm^2$, which was a magnitude greater than the threading dislocation density of the seed crystal substrate. The nitrogen density of the grown crystal was $1.4\times10^{19}/cm^3$, the boron density was not greater than the detection limit of $1\times10^{14}/cm^3$, and the chromium density was $1\times10^{17}/cm^3$.

The nitrogen density difference between the seed crystal substrate and the grown crystal was $9.3\times10^{18}/cm^3$, and the boron density difference and chromium density difference were calculated based on the minimum measurable values, the boron density difference being $8\times10^{17}/cm^3$ and the chromium density difference being $1\times10^{17}/cm^3$.

Comparative Example 2

A seed crystal substrate similar to Example 1 was used, except that it had a threading dislocation density of $1\times10^4/cm^2$ and a nitrogen density of $4.8\times10^{18}/cm^3$, and crystal growth was carried out by the same method as Example 1, except that as the nitride donor starting material there was added $Cr_2N$ powder (3N by Mitsuwa Chemicals Co., Ltd.) at 0.03 at % in terms of nitrogen atoms, based on the total amount of the nitride-containing Si—C solution, after which the grown SiC crystal was recovered.

Figure 3:
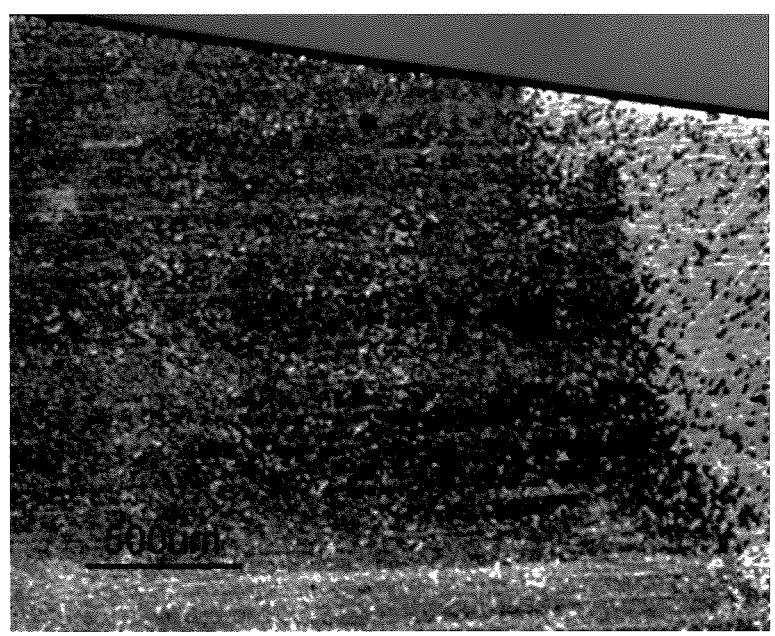
FIG. 3 is an observational photograph of threading dislocation in a SiC single crystal grown in a comparative example.

Measurement of the threading dislocation density of the grown crystal and measurement of the nitrogen density, boron density and chromium density were conducted in the same manner as Example 1. The obtained grown crystal had a diameter of 12 mm and a thickness of 3.5 mm, and the grown crystal was a SiC single crystal containing no miscellaneous crystals. FIG. 3 shows a photomicrograph of the etched surface. The threading dislocation density of the grown crystal was $1\times10^5/cm^2$, which was a magnitude greater than the threading dislocation density of the seed crystal substrate. The nitrogen density of the grown crystal was $1.1\times10^{19}/cm^3$, the boron density was not greater than the detection limit of $1\times10^{14}/cm^3$, and the chromium density was $1\times10^{17}/cm^3$.

The nitrogen density difference between the seed crystal substrate and the grown crystal was $6.2\times10^{18}/cm^3$, and the boron density difference and chromium density difference were calculated based on the minimum measurable values, the boron density difference being $8\times10^{17}/cm^3$ and the chromium density difference being $1\times10^{17}/cm^3$.

Comparative Example 3

A seed crystal substrate similar to Example 1 was used, except that it had a threading dislocation density of $1\times10^4/cm^2$ and a nitrogen density of $1.5\times10^{19}/cm^3$, and crystal growth was carried out by the same method as Example 1, except that the temperature on the surface of the Si—C solution 24 was 1900° C., and as the nitride donor starting material there was added $Cr_2N$ powder (3N by Mitsuwa Chemicals Co., Ltd.) at 0.1 at % in terms of nitrogen atoms, based on the total amount of the nitride-containing Si—C solution, after which the grown SiC crystal was recovered.

Measurement of the threading dislocation density of the grown crystal and measurement of the nitrogen density, boron density and chromium density were conducted in the same manner as Example 1. The obtained grown crystal had a diameter of 12 mm and a thickness of 2.6 mm, and the grown crystal was a SiC single crystal containing no miscellaneous crystals. The threading dislocation density of the grown crystal was $1\times10^5/cm^2$, which was a magnitude greater than the threading dislocation density of the seed crystal substrate. The nitrogen density of the grown crystal was $1.7\times10^{19}/cm3$, the boron density was not greater than the detection limit of $1\times10^{14}/cm^3$, and the chromium density was $6\times10^{17}/cm^3$.

The nitrogen density difference between the seed crystal substrate and the grown crystal was $2.0\times10^{18}/cm^3$, and the boron density difference and chromium density difference were calculated based on the minimum measurable values, the boron density difference being $8\times10^{17}/cm^3$ and the chromium density difference being $6\times10^{16}/cm^3$.

The threading dislocation densities, nitrogen densities, boron densities and chromium densities of the seed crystal substrates are shown in Table 1, the threading dislocation densities, nitrogen densities, boron densities and chromium densities of the grown crystals are shown in Table 2, and the threading dislocation density differences, nitrogen density differences, boron density differences and chromium density differences between the seed crystal substrates and grown crystals are shown in Table 3.

TABLE 1

Threading dislocation densities, nitrogen densities, boron densities and chromium densities of seed crystal substrate

|  | Threading dislocation density of seed crystal substrate ($/cm^2$) | Nitrogen density of seed crystal substrate ($/cm^3$) | Boron density of seed crystal substrate ($/cm^3$) | Chromium density of seed crystal substrate ($/cm^3$) |
|---|---|---|---|---|
| Example 1 | $3 \times 10^4$ | $4.2 \times 10^{18}$ | $8 \times 10^{17}$ | $1 \times 10^{14}$ |
| Example 2 | $1 \times 10^4$ | $4.8 \times 10^{18}$ | $8 \times 10^{17}$ | $1 \times 10^{14}$ |
| Comp. Ex. 1 | $1 \times 10^4$ | $4.7 \times 10^{18}$ | $8 \times 10^{17}$ | $1 \times 10^{14}$ |
| Comp. Ex. 2 | $1 \times 10^4$ | $4.8 \times 10^{18}$ | $8 \times 10^{17}$ | $1 \times 10^{14}$ |
| Comp. Ex. 3 | $1 \times 10^4$ | $1.5 \times 10^{19}$ | $8 \times 10^{17}$ | $1 \times 10^{14}$ |

TABLE 2

Threading dislocation densities, nitrogen densities, boron densities and chromium densities of grown crystal

|  | Threading dislocation density of grown crystal ($/cm^2$) | Nitrogen density of grown crystal ($/cm^3$) | Boron density of grown crystal ($/cm^3$) | Chromium density of grown crystal ($/cm^3$) |
|---|---|---|---|---|
| Example 1 | $3 \times 10^4$ | $1.0 \times 10^{19}$ | $1 \times 10^{14}$ | $1 \times 10^{17}$ |
| Example 2 | $1 \times 10^4$ | $8.3 \times 10^{18}$ | $1 \times 10^{14}$ | $6 \times 10^{16}$ |
| Comp. Ex. 1 | $1 \times 10^5$ | $1.4 \times 10^{19}$ | $1 \times 10^{14}$ | $1 \times 10^{17}$ |
| Comp. Ex. 2 | $1 \times 10^5$ | $1.1 \times 10^{19}$ | $1 \times 10^{14}$ | $1 \times 10^{17}$ |
| Comp. Ex. 3 | $1 \times 10^5$ | $1.7 \times 10^{19}$ | $1 \times 10^{14}$ | $6 \times 10^{16}$ |

TABLE 3

Threading dislocation density differences, nitrogen density differences, boron density differences and chromium density differences between seed crystal substrate and grown crystal

|  | Threading dislocation density difference ($/cm^2$) | Nitrogen density difference ($/cm^3$) | Boron density difference ($/cm^3$) | Chromium density difference ($/cm^3$) |
|---|---|---|---|---|
| Example 1 | 0 | $5.8 \times 10^{18}$ | $8 \times 10^{17}$ | $1 \times 10^{17}$ |
| Example 2 | 0 | $3.5 \times 10^{18}$ | $8 \times 10^{17}$ | $6 \times 10^{16}$ |
| Comp. Ex. 1 | $9 \times 10^4$ | $9.3 \times 10^{18}$ | $8 \times 10^{17}$ | $1 \times 10^{17}$ |
| Comp. Ex. 2 | $9 \times 10^4$ | $6.2 \times 10^{18}$ | $8 \times 10^{17}$ | $1 \times 10^{17}$ |
| Comp. Ex. 3 | $9 \times 10^4$ | $2.0 \times 10^{18}$ | $8 \times 10^{17}$ | $6 \times 10^{16}$ |

Figure 4:
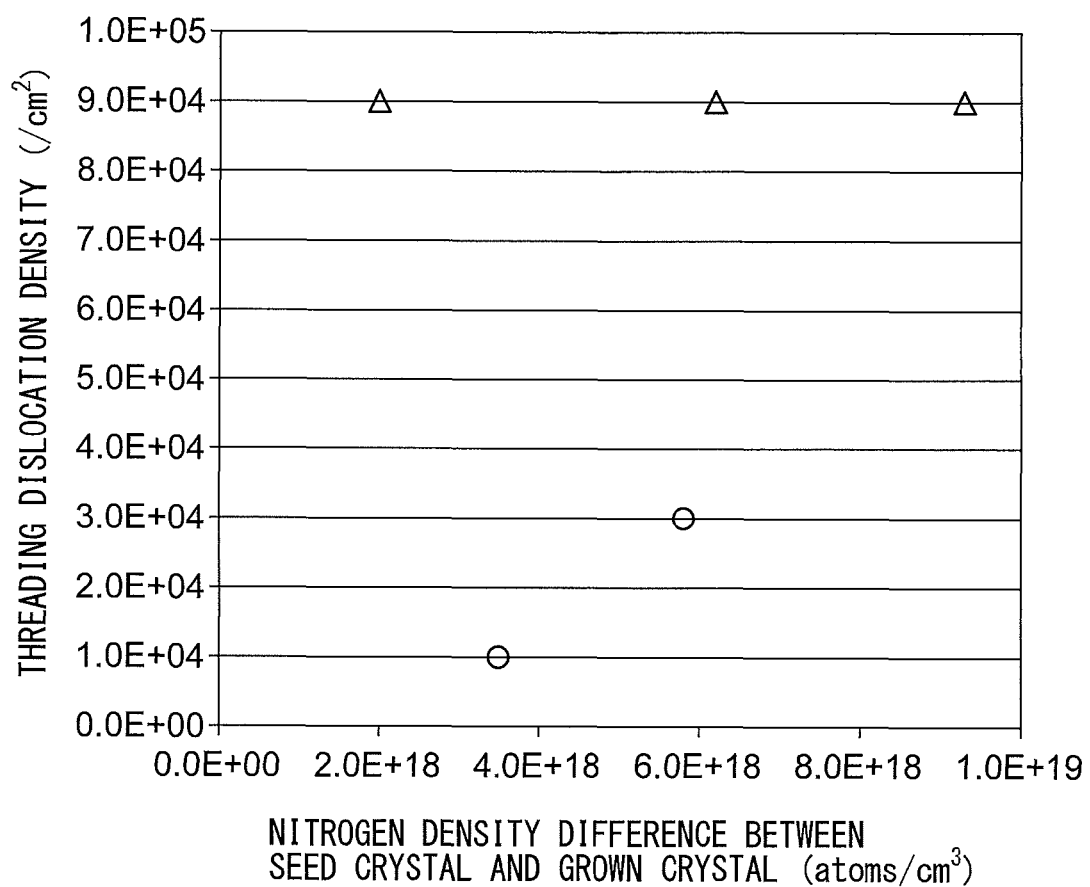
FIG. 4 is a graph showing the relationship between nitrogen density difference in a seed crystal substrate and grown crystal, and threading dislocation density in the grown crystal.

FIG. 4 is a graph showing the relationship between nitrogen density difference in a seed crystal substrate and grown crystal, and threading dislocation density in the grown crystal.

EXPLANATION OF SYMBOLS

100 Single crystal production apparatus
10 Graphite crucible
12 Graphite shaft
14 Seed crystal substrate
18 Heat-insulating material
22 High-frequency coil
22A Upper level high-frequency coil
22B Lower level high-frequency coil
24 Si—C solution
26 Quartz tube

What is claimed is:

1. A method for producing a SiC single crystal, comprising using a Si—C solution having a temperature gradient in which the temperature decreases from the interior toward the surface to grow a SiC single crystal from a SiC seed crystal substrate, wherein:
the Si—C solution includes Si and Cr,
the boron density difference Bs–Bg between the boron density Bs in the seed crystal substrate and the boron density Bg in the growing SiC single crystal is $1\times10^{17}/cm^3$ or greater,
the chromium density difference Crg–Crs between the chromium density Crs in the seed crystal substrate and the chromium density Crg in the growing SiC single crystal is $1\times10^{16}/cm^3$ or greater, and
the nitrogen density difference Ng–Ns between the nitrogen density Ns in the seed crystal substrate and the nitrogen density Ng in the growing SiC single crystal is $3.5\times10^{18}/cm^3$ to $5.8\times10^{18}/cm^3$.

2. The method for producing a SiC single crystal according to claim 1, wherein the boron density difference Bs–Bg is $8\times10^{17}/cm^3$ or greater.

3. The method for producing a SiC single crystal according to claim 1, wherein the chromium density difference Crg–Crs is $6\times10^{16}/cm^3$ or greater.

4. The method for producing a SiC single crystal according to claim 1, wherein the seed crystal substrate is one that has been grown by a sublimation process.

5. The method for producing a SiC single crystal according to claim 1, wherein the Si—C solution has a composition of Si/Cr=50 to 80/20 to 50, as the atomic composition percentage.

6. The method for producing a SiC single crystal according to claim 1, wherein the Si—C solution has a surface temperature of 1800 to 2200° C.

* * * * *